United States Patent
Cheng et al.

(10) Patent No.: US 8,709,849 B2
(45) Date of Patent: Apr. 29, 2014

(54) WAFER LEVEL PACKAGING

(71) Applicant: Taiwan Semiconductor Manufacturing Company, Ltd, Hsin-Chu (TW)

(72) Inventors: Chun-Wen Cheng, Hsinchu (TW);
Chung-Hsien Lin, Hsinchu (TW);
Chia-Hua Chu, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/710,389

(22) Filed: Dec. 10, 2012

(65) Prior Publication Data

US 2013/0102101 A1    Apr. 25, 2013

Related U.S. Application Data

(63) Continuation of application No. 12/879,216, filed on Sep. 10, 2010, now Pat. No. 8,330,559.

(51) Int. Cl.
*B81C 1/00* (2006.01)

(52) U.S. Cl.
USPC .......................................................... 438/51

(58) Field of Classification Search
USPC .......................................................... 438/689
See application file for complete search history.

(56) References Cited

U.S. PATENT DOCUMENTS

| | | | |
|---|---|---|---|
| 5,963,788 A | 10/1999 | Barron et al. | |
| 6,842,009 B2 * | 1/2005 | Potter | 324/633 |
| 7,023,065 B2 * | 4/2006 | Ayazi et al. | 257/414 |
| 7,227,432 B2 * | 6/2007 | Lutz et al. | 333/186 |
| 8,330,559 B2 * | 12/2012 | Cheng et al. | 333/197 |
| 2007/0052327 A1 * | 3/2007 | Vilander | 310/343 |
| 2007/0281381 A1 | 12/2007 | Ayazi | |
| 2008/0233672 A1 | 9/2008 | Heck | |

* cited by examiner

*Primary Examiner* — Thao P. Le
(74) *Attorney, Agent, or Firm* — Haynes and Boone, LLP

(57) ABSTRACT

A method of wafer level packaging includes providing a substrate including a buried oxide layer and a top oxide layer, and etching the substrate to form openings above the buried oxide layer and a micro-electro-mechanical systems (MEMS) resonator element between the openings, the MEMS resonator element enclosed within the buried oxide layer, the top oxide layer, and sidewall oxide layers. The method further includes filling the openings with polysilicon to form polysilicon electrodes adjacent the MEMS resonator element, removing the top oxide layer and the sidewall oxide layers adjacent the MEMS resonator element, bonding the polysilicon electrodes to one of a complementary metal-oxide semiconductor (CMOS) wafer or a carrier wafer, removing the buried oxide layer adjacent the MEMS resonator element, and bonding the substrate to a capping wafer to seal the MEMS resonator element between the capping wafer and one of the CMOS wafer or the carrier wafer.

20 Claims, 11 Drawing Sheets

WAFER LEVEL PACKAGING

CROSS-REFERENCE

This application is a continuation application of U.S. Ser. No. 12/879,216 filed Sep. 10, 2010, now U.S. Pat. No. 8,330,559, issued Dec. 11, 2012, and entitled, "Wafer Level Packaging," the entire disclosures of which are incorporated herein by reference.

BACKGROUND

Wafer level packaging (WLP) technology provides for the packaging of semiconductor devices at a wafer level. WLP is employed in a variety of technologies including 3D-integrated circuits (IC), chip scale package (CSP) devices, and micro-electro-mechanical systems (MEMS). Potential advantages of using WLP technology include enhancing electrical properties, providing for increased density, reducing device sizes, reducing costs, and allowing for additional testing at wafer level. However, there are several limitations to the current WLP technology and the integration of the wafer fabrication and packaging processes it provides. The methods of packaging (e.g., protecting the device and providing interconnections to the outside world) may not be compatible with the fabrication processes that are used to form the devices. Furthermore, solutions often require complicated packaging schemes that suffer area penalties.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
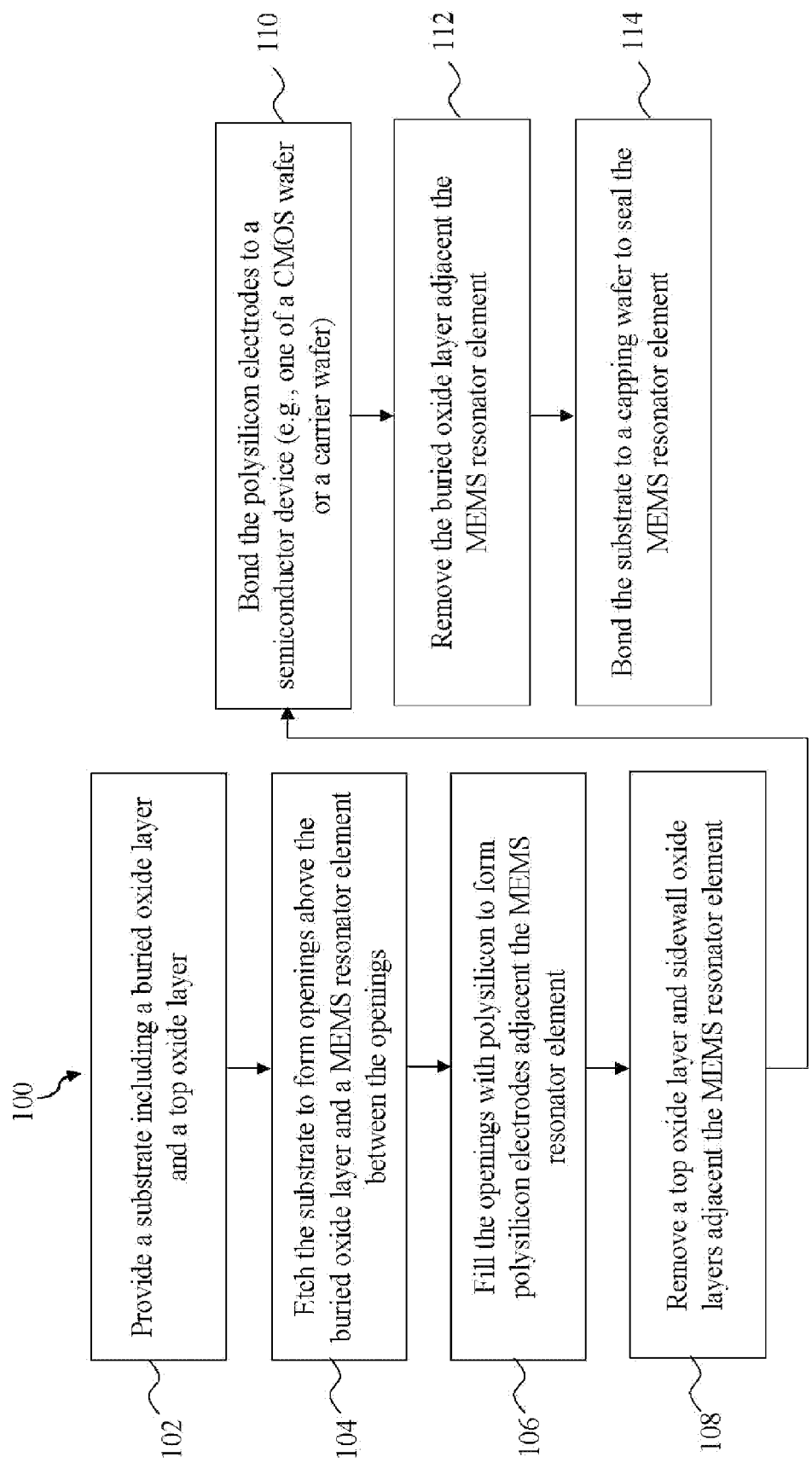
FIG. 1 is a flowchart of a method of wafer level packaging to provide a stand-alone micro-electro-mechanical systems (MEMS) device or a monolithic semiconductor device-MEMS device in accordance with an embodiment of the present disclosure.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

It is understood that several processing steps and/or features of a device may be only briefly described, such steps and/or features being well known to those of ordinary skill in the art. Also, additional processing steps or features can be added, and certain of the following processing steps or features can be removed and/or changed while still implementing the claims. Thus, the following description should be understood to represent examples only, and are not intended to suggest that one or more steps or features is required.

It is further understood that the present disclosure refers generally to WLP to refer to the packaging of a substrate. The substrates described herein may take various forms including but not limited to wafers (or portions thereof) having integrated circuits including those formed by CMOS-based processes, die, micro-electro-mechanical systems (MEMS) substrates, capping substrates, a single substrate with CMOS devices and MEMS devices formed thereon, and the like. In contrast, a carrier wafer may not include an integrated circuit. Furthermore, as described above, specific embodiments may be described herein which are exemplary only and not intended to be limiting. For example, embodiments that refer to a substrate being a MEMS substrate, a CMOS substrate, or the like are exemplary only and not intended to limit the disclosure to any particular technology.

FIG. 1 is a flowchart illustrating a method 100 for wafer level packaging to provide a stand-alone MEMS device or a monolithic semiconductor device-MEMS device in accordance with an embodiment of the present disclosure. The method 100 begins at block 102 where a substrate including a buried oxide layer and a top oxide layer is provided. At block 104, the substrate is etched to form openings above the buried oxide layer and a MEMS resonator element between the openings. The MEMS resonator element is enclosed within the buried oxide layer, the top oxide layer, and sidewall oxide layers. At block 106, the openings are filled with polysilicon to form polysilicon electrodes adjacent the MEMS resonator element. At block 108, the top oxide layer and the sidewall oxide layers adjacent the MEMS resonator element are removed. At block 110, the polysilicon electrodes are bonded to a semiconductor device, such as one of a complementary metal-oxide semiconductor (CMOS) wafer or a carrier wafer. At block 112, the buried oxide layer adjacent the MEMS resonator element is removed. At block 114, the substrate is bonded to a capping wafer to seal the MEMS resonator element between the capping wafer and one of the CMOS wafer or the carrier wafer.

Accordingly, method 100 provides for bonding of a MEMS device between a capping wafer and semiconductor device, such as a CMOS device or a carrier wafer. However, the MEMS device may be bonded to one of various semiconductor devices, and/or other suitable active and/or passive devices. Example semiconductor devices include integrated circuits including a metal-insulator-semiconductor field effect transistor (MOSFET) including complementary MOSFET (CMOS) features, CIS, and/or other suitable active and/or passive devices. In an embodiment, the semiconductor device includes an integrated circuit (or portion thereof) designed and formed using a CMOS-based process. A substrate including a semiconductor device formed using CMOS technology may be referred to herein as a CMOS substrate or a CMOS wafer. A MEMS device or substrate may be a silicon wafer including MEMS features and/or functionalities. A substrate having a device (e.g., integrated circuit) formed by other semiconductor fabrication technologies is also within the scope of the described method.

In another example, the carrier wafer and/or the capping wafer is a silicon wafer. Alternatively or additionally, the substrate of the MEMS device, the semiconductor device, the carrier wafer, and/or the capping wafer may include other elementary semiconductor, such as germanium, or the substrate may include a compound semiconductor, such as silicon carbide, gallium arsenic, indium arsenide, and/or indium phosphide.

Figure 2A:
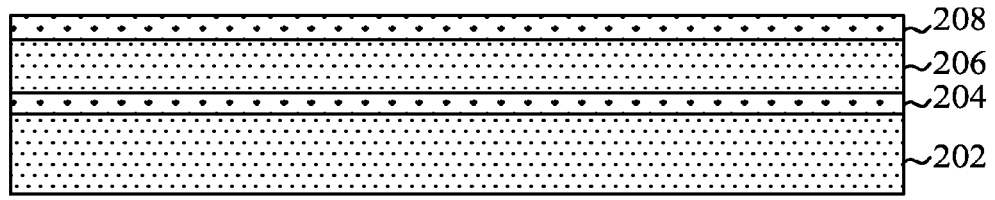
FIGS. 2A-2L are cross-sectional views of a stand-alone MEMS device or a monolithic semiconductor device-MEMS device at various stages of fabrication in accordance with an embodiment of the present disclosure.

Referring now to FIGS. 2A-2L, cross-sectional views are shown of a stand-alone MEMS device or a monolithic semiconductor device-MEMS device at various stages of fabrication in accordance with an embodiment of the present disclosure. FIG. 2A illustrates a substrate 202 including a buried oxide layer 204 and a top oxide layer 208. The portion of substrate 202 between buried oxide layer 204 and top oxide layer 208 is denoted by reference number 206. In one example, a MEMS device is formed on a silicon-on-insulator (SOI) wafer. Substrate 202, 206 is comprised of single crystal silicon in one example, but may be comprised of other materials and include other structures as noted above.

Figure 2B:
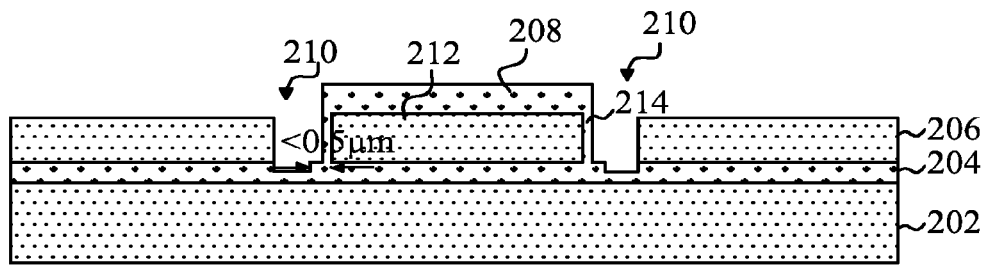

FIG. 2B illustrates a patterned etch of the top oxide layer 208 and substrate 206 to form openings 210 above buried oxide layer 204 and a micro-electro-mechanical systems (MEMS) resonator element 212 between the openings 210. The MEMS resonator element 212 is enclosed within the buried oxide layer 204, the top oxide layer 208, and sidewall oxide layers 214. In one example, an isotropic oxide etcher with CF4 etchant gas may be used in conjunction with a patterned photoresist for the patterned etch of the top oxide layer 208 and substrate 206. In one embodiment, the etch process may etch a portion of buried oxide layer 204.

Figure 2C:
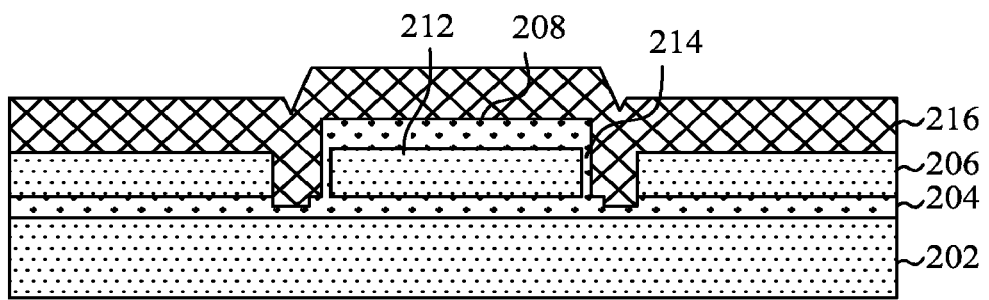

FIG. 2C illustrates a deposition of polysilicon over the openings 210 to form a polysilicon layer 216 that fills openings 210. In one example, polysilicon layer 216 has a thickness between about 3 micron and about 4 micron, and is deposited by one of various techniques, such as chemical vapor deposition (CVD), low pressure CVD (LPCVD), and the like, at a temperature between about 800 degrees Celsius and about 1,000 degrees Celsius.

Figure 2D:
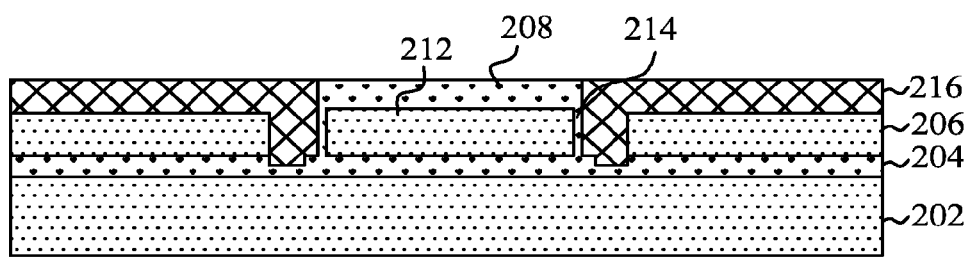

FIG. 2D illustrates a planarization of the polysilicon layer 216 to expose top oxide layer 208. In one example, polysilicon layer 216 is planarized by a chemical mechanical polish (CMP) process.

Figure 2E:
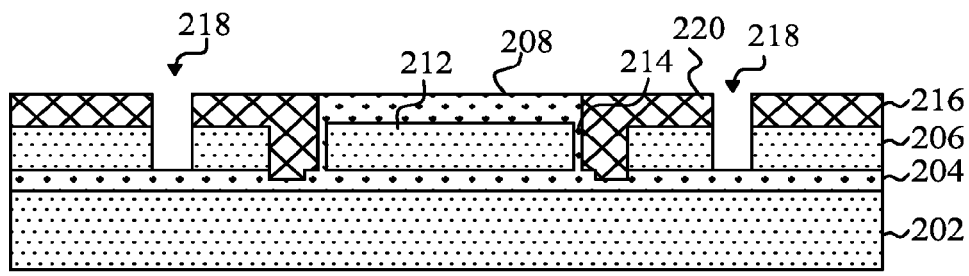

FIG. 2E illustrates a patterned etch through polysilicon layer 216 and substrate 206 to form openings 218 and polysilicon electrodes 220 adjacent the MEMS resonator element 212. In one example, the polysilicon electrodes 220 are each formed to have an "L" shape with one leg disposed within opening 210 and another leg disposed over substrate 206.

Figure 2F:
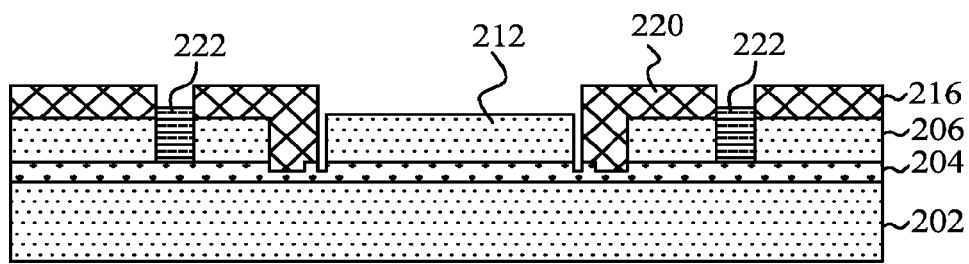

FIG. 2F illustrates the formation of plugs 222 within openings 218 for the protection of buried oxide layer 204. In one example, photoresist plugs are formed as a low viscosity photoresist layer is deposited and etched to control the height of the plugs 222 within openings 218. As illustrated, plugs 222 are formed to have a height below polysilicon layer 216 but may be formed to have other heights as applicable. Subsequent processing then removes top oxide layer 208 and the sidewall oxide layers 214 to expose the MEMS resonator element 212. In one example, top oxide layer 208 and sidewall oxide layers 214 are removed by a vapor hydrogen-fluorine (HF) etch.

Figure 2G:
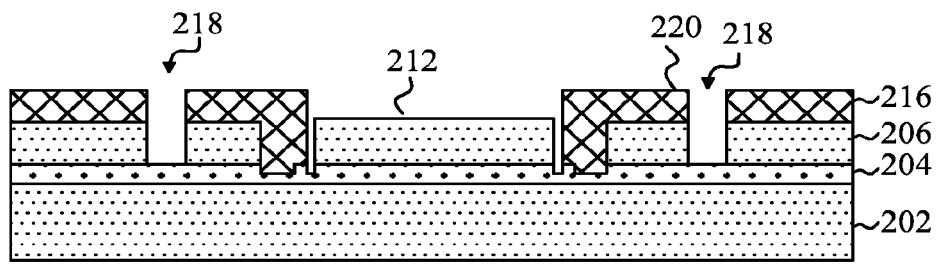

FIG. 2G illustrates the MEMS device after plugs 222 have been removed. In one example, photoresist plugs may be removed by a plasma etch at temperatures between about 200 degrees Celsius and about 300 degrees Celsius.

Figure 2H:
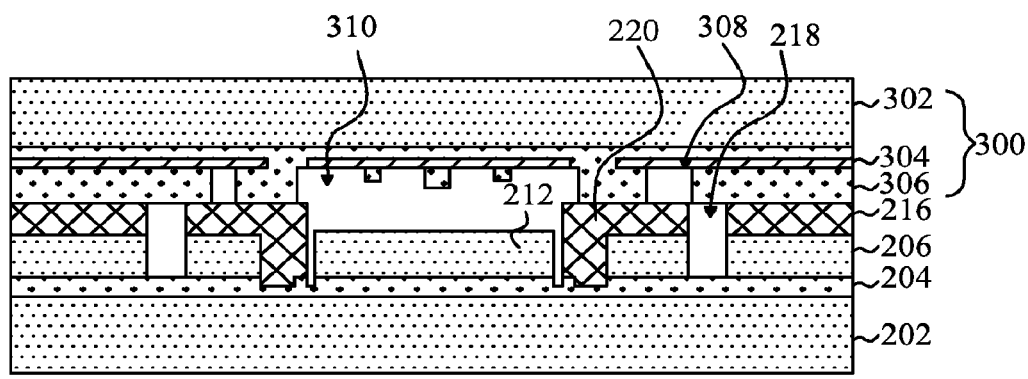

FIG. 2H illustrates the MEMS device bonded to a semiconductor device 300, which in one embodiment includes a substrate 302, a metal layer 304, an interlayer dielectric (ILD) 306, openings 308, and a cavity 310. In one example, the MEMS device is fusion bonded to the semiconductor device 300 at a temperature less than about 480 degrees Celsius, with a bonding force less than about 5N and a bonding time less than about 10 minutes. In yet another example, the semiconductor device 300 is a CMOS wafer and the polysilicon layer 216 of the MEMS device is fusion bonded to the ILD 306 of the CMOS wafer, which provides a stand-off feature with cavity 310, the stand-off feature being configured to provide the appropriate separation between the semiconductor device and the MEMS device to which it is to be bonded to. The MEMS resonator element 212 provides a reference mass that is used to measure the variable to which the MEMS is directed. Alternatively, the semiconductor device 300 may be a carrier wafer including a stand-off feature and may not include an integrated circuit. Advantageously, the present disclosure provides a wafer level packaging scheme applicable to the fabrication of both a stand-alone MEMS device or a monolithic semiconductor device-MEMS device.

Figure 2I:
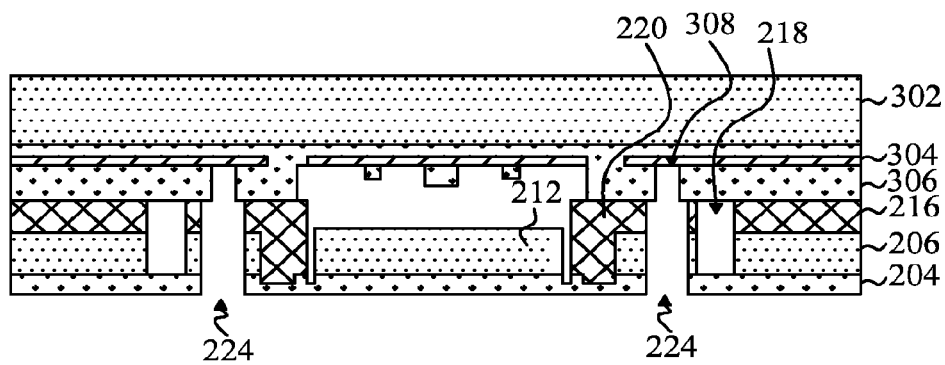

FIG. 2I illustrates removal of the substrate 202 and a subsequent etch through buried oxide layer 204, substrate 206, and polysilicon electrodes 220 to form openings 224 which connect to openings 308. In one example, substrate 202 may be removed by a wet etch process, such as etching in a tetramethylammonium hydroxide (TMAH) wet etch tank. In another example, openings 224 have a wider diameter than openings 308.

Figure 2J:
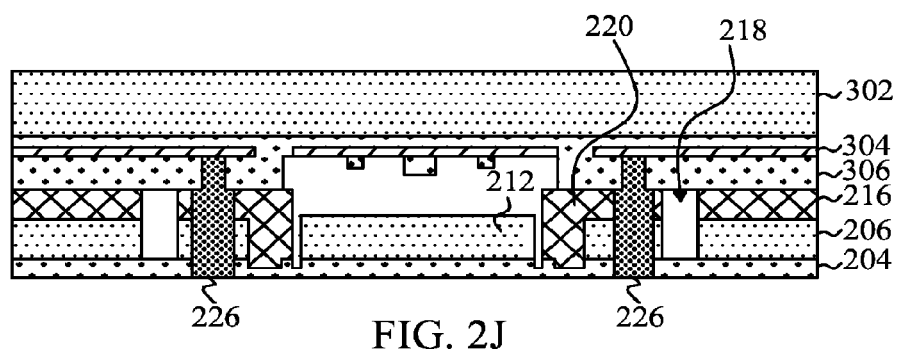

FIG. 2J illustrates the formation of plugs 226 in openings 224 and 308 to provide an electrical connection between polysilicon electrode 220 and metal layer 304 of the semiconductor device 300. In one example, plugs 226 are comprised of tungsten and shaped to have a smaller diameter portion disposed within opening 308 and a wider diameter portion disposed within opening 224. Openings 218 provide for electrical isolation of plugs 226. A metal layer is deposited and then etched back to form plugs 226 within openings 224 and 308, and in one example, a tungsten layer is deposited by CVD at a process temperature less than about 500 degrees Celsius. Other deposition techniques are applicable and may be used.

Figure 2K:
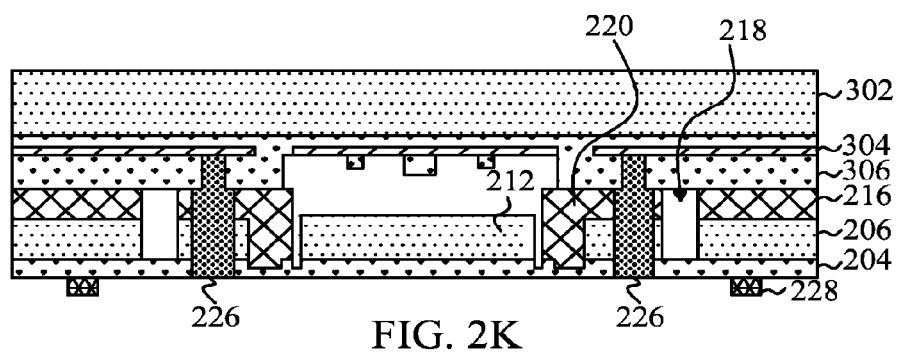

FIG. 2K illustrates the formation of a bonding layer 228 on buried oxide layer 204, which is subsequently removed adjacent MEMS resonator element 212, as shown and described below with respect to FIG. 2L. The bonding layer 228 may be patterned by a wet etch process in one example. Alternatively, portions of the buried oxide layer 204 adjacent the MEMS resonator element 212 may be removed prior to formation of the bonding layer 228 on a remaining portion of buried oxide layer 228.

Figure 2L:
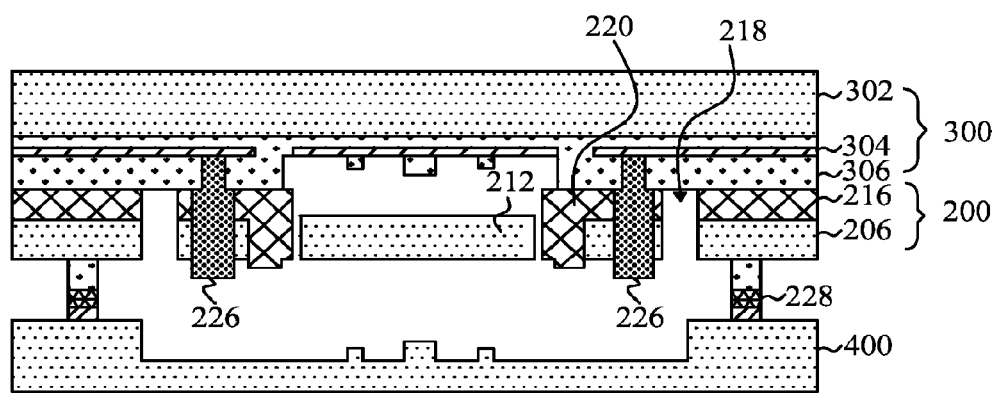

FIG. 2L illustrates the removal of buried oxide layer 204 to release MEMS resonator element 212. In one example, buried oxide layer 204 is removed by a vapor HF etch. Substrate 206 is then bonded to a capping wafer 400 to seal the MEMS resonator element 212 between the capping wafer 400 and the semiconductor device 300. In other words, MEMS device 200 is sandwiched between capping wafer 400 and semiconductor device 300, which in one example is one of a CMOS wafer or a carrier wafer, and MEMS resonator element 212 is sealed within a cavity between semiconductor device 300 and capping wafer 400, both of which may include stand-off features for formation of the cavity for the MEMS resonator element 212.

According to one aspect, the bonding layer 228 may be comprised of a metal and/or silicon. Examples of the bonding layer compositions include amorphous silicon, polysilicon, a combination of amorphous silicon and polysilicon, silicon doped with one or more impurities, and other suitable substantially silicon-based compositions. The bonding layer may be formed by physical vapor deposition (PVD), chemical vapor deposition (CVD), evaporation, electron beam evaporation (E-gun), ion beam, energy beam, combinations thereof, and/or other suitable deposition processes. Other manufacturing techniques used to form the bonding layer may include photolithography processing and/or etching to pattern the bonding layer. In another embodiment, the bonding layer 228 includes aluminum or a substantially aluminum-based bonding layer, which may also be formed by one of various techniques, such as PVD, CVD, or the like as noted above.

Bonding layer 228 is bonded to capping wafer 400 by a bonding process. In particular, the bonding layer 228 is bonded to a surface of the capping wafer 400, which in one embodiment may include another bonding layer. Thus, bonding layer 228, which may include silicon, is bonded to a bonding layer of the capping wafer, which may include aluminum. In doing so, the bonding layer of the MEMS device 300 and the bonding layer of the capping wafer 400 are physically bonded (e.g., coupled). The bonding may be provided by a solid-phase reaction. In one example, bonding layer 228 is eutectic bonded to capping wafer 400 with a bonding force greater than about 15 kN at a temperature greater than about 400 degrees Celsius. In another example, bonding layer 228 may include a metal and the bonding layer of the capping wafer 400 may include silicon. Accordingly, in one embodiment a substantially silicon-based bonding layer may be provided on a MEMS substrate and a substantially aluminum-based bonding layer may be provided on the capping substrate, and in another embodiment, a substantially silicon-based bonding layer is disposed on the capping substrate and a substantially aluminum-based bonding layer is disposed on the MEMS substrate.

The bonding process may be performed in the presence of a forming gas and/or another controllable environment. Example forming gases include argon, nitrogen (N2), hydrogen (H2), nitrogen/hydrogen mixture, and/or other suitable gases. The forming gases may serve to de-oxidize the bonding layer(s).

In an embodiment, a surface clean is performed prior to the bonding process. In other embodiments, the surface cleaning step may be omitted. The surface clean may include a wet etch, a dry etch, or combinations thereof. Example wet etch/clean processes include exposure to hydrofluoric acid (HF) including dilute HF. Example dry etch processes include argon sputtering and plasma etch processes. The cleaning process may include other suitable processes such as de-ionized water rinses and drying processes (e.g., spin dry). The clean may serve to de-oxidize the bonding layer(s). In an embodiment, a post-bonding thermal process is performed (e.g., anneal). The bonding may be performed by a commercially available wafer bonder, and an alignment process is typically performed prior to the bonding process.

Referring now to FIGS. 3A-3F, cross-sectional views are shown of a stand-alone MEMS device or a monolithic semiconductor device-MEMS device at various stages of fabrication in accordance with another embodiment of the present disclosure.

Figure 3A:
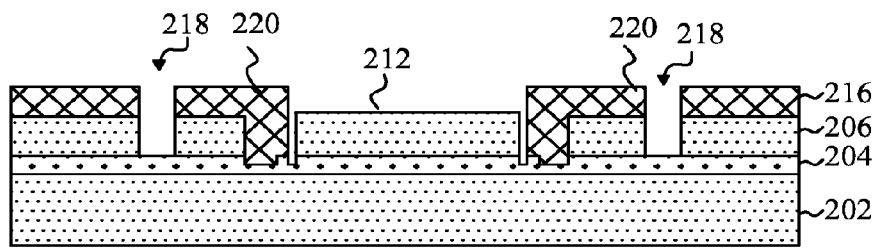
FIGS. 3A-3F are cross-sectional views of a stand-alone MEMS device or a monolithic semiconductor device-MEMS device at various stages of fabrication in accordance with another embodiment of the present disclosure.

FIG. 3A illustrates substrates 202, 206 including buried oxide layer 204, polysilicon layer 216, openings 218, polysilicon electrodes 220, and MEMS resonator element 212. The structure shown in FIG. 3A is fabricated by substantially the same steps and processes and include substantially similar structures as illustrated in and described above with respect to FIGS. 2A-2G. As such, the steps and structures for fabrication of the structure shown in FIG. 3A are not repeated here but are fully applicable in this embodiment.

Figure 3B:
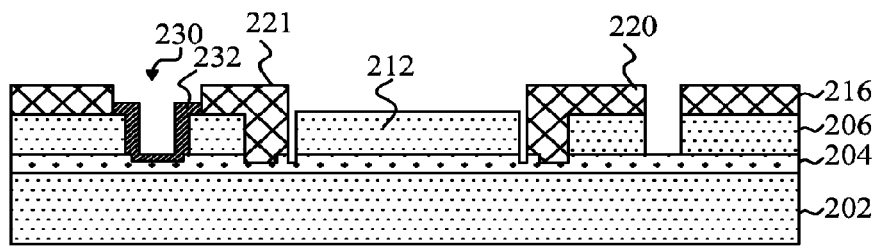

FIG. 3B illustrates a patterned etch of polysilicon electrode 220 and substrate 206 to form an opening 230 above the buried oxide layer 204. Typical photolithographic patterning and etch techniques may be used. Afterwards, an aluminum nitride (AlN) film 232 is deposited and patterned over the opening 230, and in one example the AlN film is deposited in a deposition process temperature below about 550 degrees Celsius, and patterned by a wet etch.

Figure 3C:
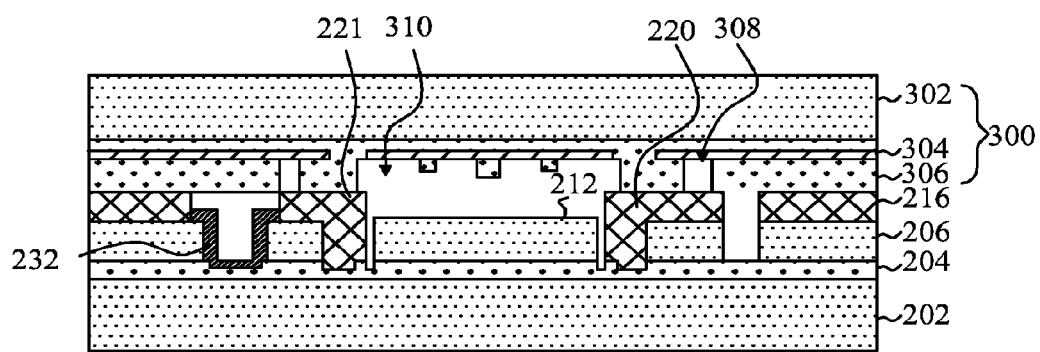

Similar to FIG. 2H above, FIG. 3C illustrates the MEMS device bonded to a semiconductor device 300, which in one embodiment includes a substrate 302, a metal layer 304, an interlayer dielectric (ILD) 306, openings 308, and a cavity 310. In one example, the MEMS device is fusion bonded to the semiconductor device 300 at a temperature less than about 480 degrees Celsius. In yet another example, the semiconductor device 300 is a CMOS wafer and the polysilicon layer 216 of the MEMS device is fusion bonded to the ILD 306 of the CMOS wafer, which provides a stand-off feature with cavity 310, the stand-off feature being configured to provide the appropriate separation between the semiconductor device and the MEMS device to which it is to be bonded to. The MEMS resonator element 212 provides a reference mass that is used to measure the variable to which the MEMS is directed. Alternatively, the semiconductor device 300 may be a carrier wafer including a stand-off feature and may not include an integrated circuit. Advantageously, the present disclosure provides a wafer level packaging scheme applicable to the fabrication of both a stand-alone MEMS device or a monolithic semiconductor device-MEMS device.

Figure 3D:
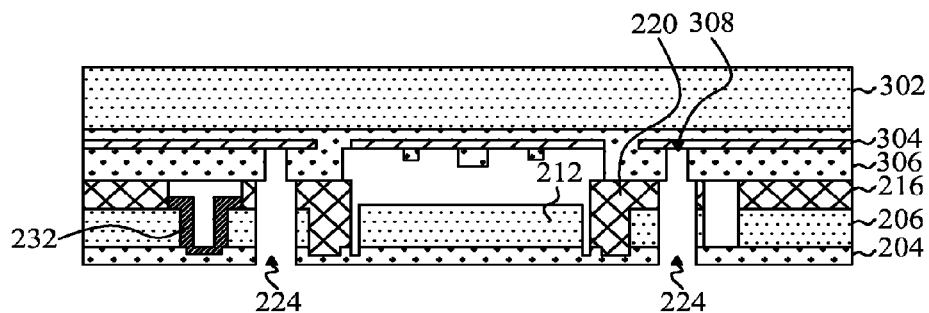

Similar to FIG. 2I above, FIG. 3D illustrates removal of the substrate 202 and a subsequent etch through buried oxide layer 204, substrate 206, and polysilicon electrodes 220 to form openings 224 which connect to openings 308. In one example, substrate 202 may be removed by a wet etch process, such as etching in a tetramethylammonium hydroxide (TMAH) wet etch tank. In another example, openings 224 have a wider diameter than openings 308.

Figure 3E:
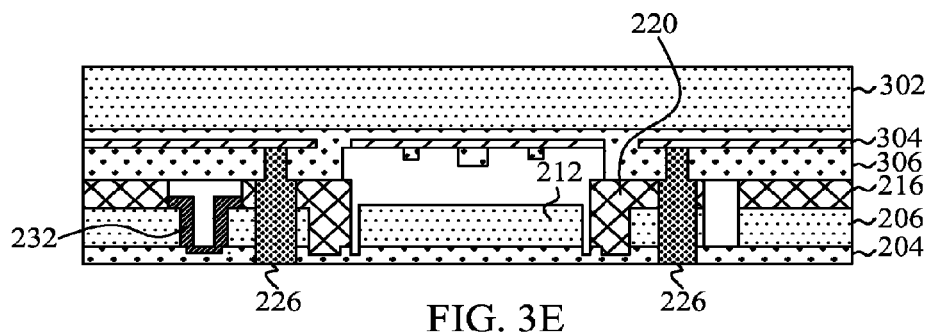

Similar to FIG. 2J above, FIG. 3E illustrates the formation of plugs 226 in openings 224 and 308 to provide an electrical connection between polysilicon electrode 220 and metal layer 304 of the semiconductor device 300. In one example, plugs 226 are comprised of tungsten and shaped to have a smaller diameter portion disposed within opening 308 and a wider diameter portion disposed within opening 224. Openings 218 provide for electrical isolation of plugs 226. A metal layer is deposited and then etched back to form plugs 226 within openings 224 and 308, and in one example, a tungsten layer is deposited by CVD at a process temperature less than about 500 degrees Celsius. Other deposition techniques are applicable and may be used.

Figure 3F:
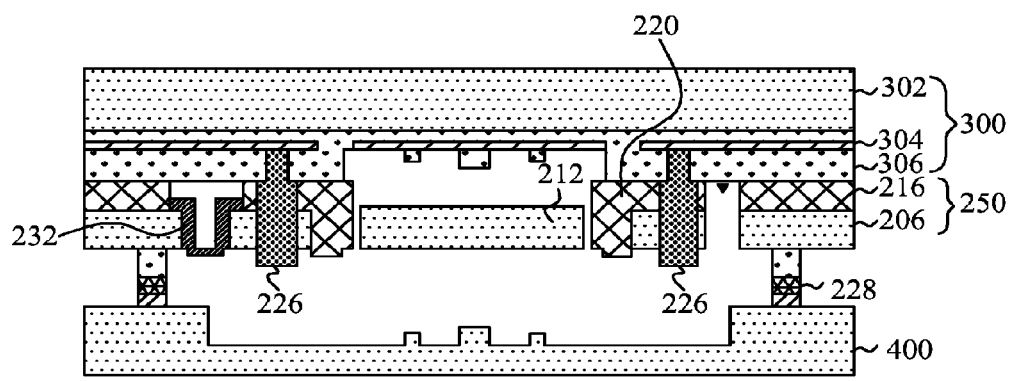

Finally, similar to FIGS. 2K and 2L above, FIG. 3F illustrates the formation of a bonding layer 228 on buried oxide layer 204, which is subsequently removed adjacent MEMS resonator element 212. The bonding layer 228 may be patterned by a wet etch process in one example. Alternatively, portions of the buried oxide layer 204 adjacent the MEMS resonator element 212 may be removed prior to formation of the bonding layer 228 on a remaining portion of buried oxide layer 228. The removal of buried oxide layer 204 releases MEMS resonator element 212. In one example, buried oxide layer 204 is removed by a vapor HF etch. Substrate 206 is then bonded to a capping wafer 400 to seal the MEMS resonator element 212 between the capping wafer 400 and the semiconductor device 300. In other words, MEMS device 200 is sandwiched between capping wafer 400 and semiconductor device 300, which in one example is one of a CMOS wafer or a carrier wafer, and MEMS resonator element 212 is sealed within a cavity between semiconductor device 300 and capping wafer 400, both of which may include stand-off features for formation of the cavity for the MEMS resonator element 212.

Referring now to FIGS. 4A-4L, cross-sectional views are shown of a stand-alone MEMS device or a monolithic semiconductor device-MEMS device at various stages of fabrication in accordance with another embodiment of the present disclosure.

Figure 4A:
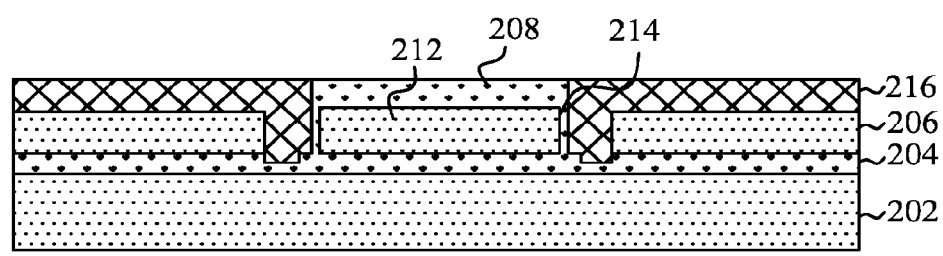
FIGS. 4A-4L are cross-sectional views of a stand-alone MEMS device or a monolithic semiconductor device-MEMS device at various stages of fabrication in accordance with another embodiment of the present disclosure.
Figure 4B:
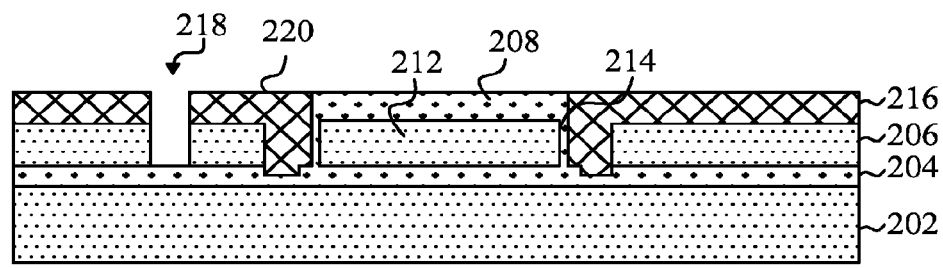
Figure 4C:
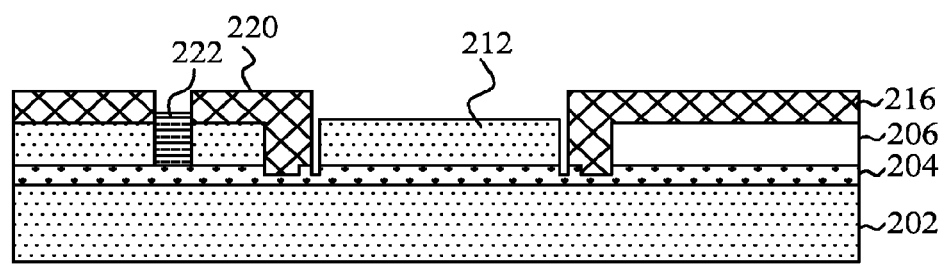
Figure 4D:
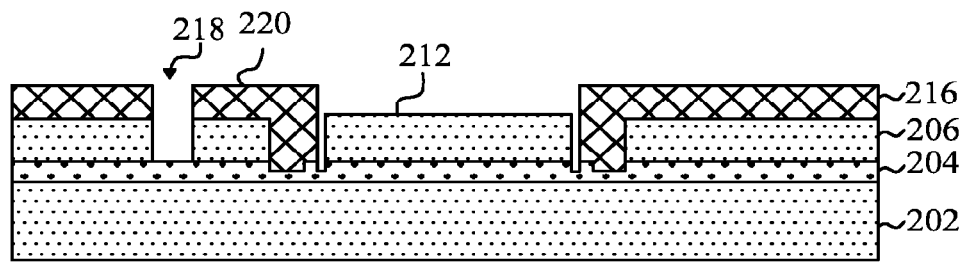
Figure 4E:
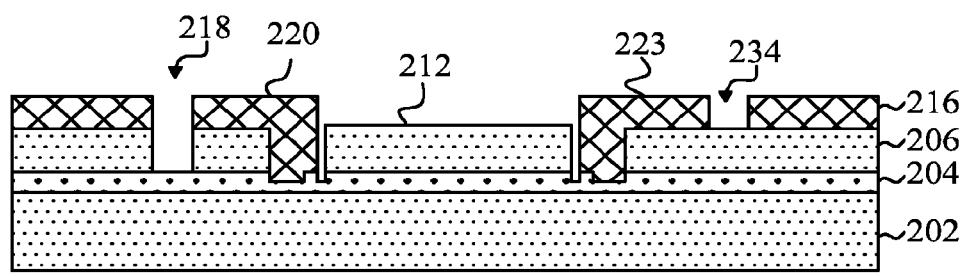

FIG. 4A illustrates substrates 202, 206 including buried oxide layer 204, polysilicon layer 216, and MEMS resonator element 212 enclosed by top oxide layer 208, buried oxide layer 204, and sidewall oxide layers 214. FIG. 4A is fabricated by substantially the same steps and processes and includes substantially similar structures as illustrated in and described above with respect to FIGS. 2A-2D. As such, the steps and processes for fabrication of the structure shown in FIG. 4A are not repeated here but are fully applicable in this embodiment.

FIG. 4B-4E illustrate a patterned etch of the polysilicon layer 216 and substrate 206 to form opening 218, formation of a plug 222 within opening 218, removal of the top oxide layer 208 and sidewall oxide layers 214, and removal of the plug 222, similar to the processes illustrated in and described above with respect to FIGS. 2E-2G. In this embodiment, opening 218 is formed on only one side of the MEMS resonator element 212 and an opening 234 is formed above substrate 206 on the other side of the MEMS resonator element 212.

Figure 4F:
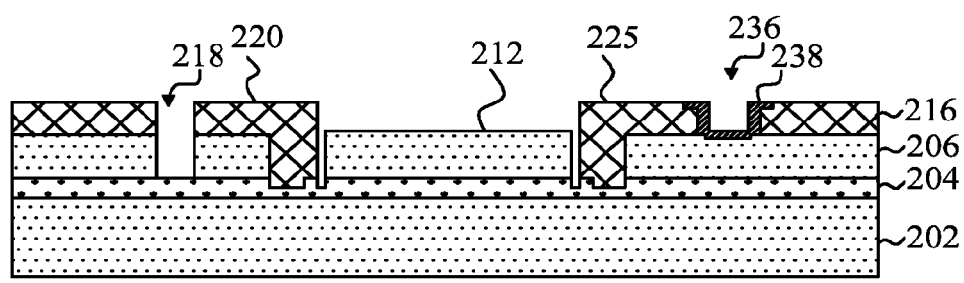

FIG. 4F illustrates a further etch of the polysilicon layer 216 to form opening 236 and a subsequent deposition and patterning of an aluminum nitride (AlN) film 238 over the opening 236. Polysilicon layer 216 may be patterned by an isotropic etch to form opening 236 and the AlN film 238 may be deposited by one of various processes under a temperature of about 550 degrees Celsius. The AlN film 238 may then be patterned by a wet etch.

Figure 4G:
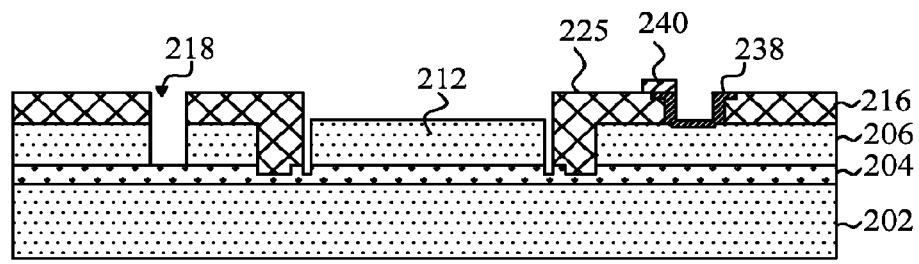

FIG. 4G illustrates the deposition and patterning of an aluminum film 240 above the AlN film 238. In one example, the aluminum film 240 is deposited by one of various deposition processes under a temperature of about 250 degrees Celsius, and patterned as an upper electrode by a wet etch process.

Figure 4H:
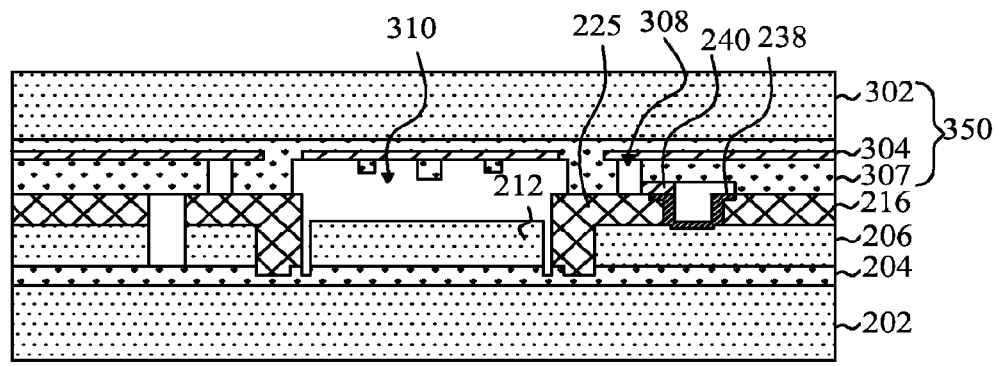

Similar to FIG. 2H above, FIG. 4H illustrates illustrates the MEMS device bonded to a semiconductor device 350, which in one embodiment includes a substrate 302, a metal layer 304, an interlayer dielectric (ILD) 306, openings 308, and a cavity 310. In one example, the MEMS device is fusion bonded to the semiconductor device 350 at a temperature less than about 480 degrees Celsius. In yet another example, the semiconductor device 350 is a CMOS wafer and the polysilicon layer 216 of the MEMS device is fusion bonded to the ILD 306 of the CMOS wafer, which provides a stand-off feature with cavity 310, the stand-off feature being configured to provide the appropriate separation between the semiconductor device and the MEMS device to which it is to be bonded to. The MEMS resonator element 212 provides a reference mass that is used to measure the variable to which the MEMS is directed. Alternatively, the semiconductor device 350 may be a carrier wafer including a stand-off feature and may not include an integrated circuit. Advantageously, the present disclosure provides a wafer level packaging scheme applicable to the fabrication of both a stand-alone MEMS device or a monolithic semiconductor device-MEMS device.

Figure 4I:
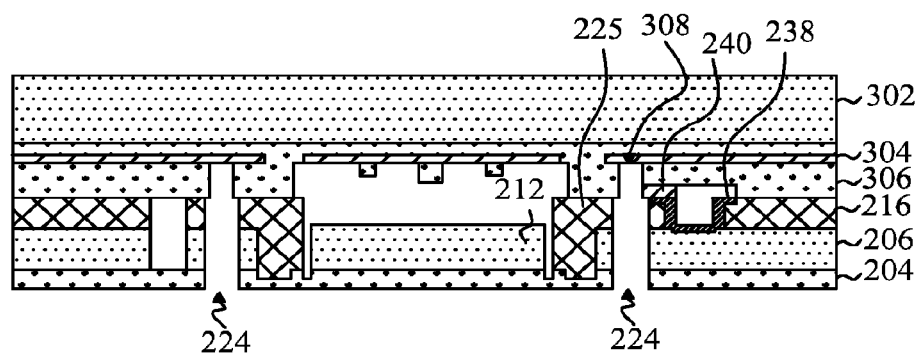

Similar to FIG. 2I above, FIG. 4I illustrates removal of the substrate 202 and a subsequent etch through buried oxide layer 204, substrate 206, and polysilicon electrodes 220 to form openings 224 which connect to openings 308. In one example, substrate 202 may be removed by a wet etch process, such as etching in a tetramethylammonium hydroxide (TMAH) wet etch tank. In another example, openings 224 have a wider diameter than openings 308.

Figure 4J:
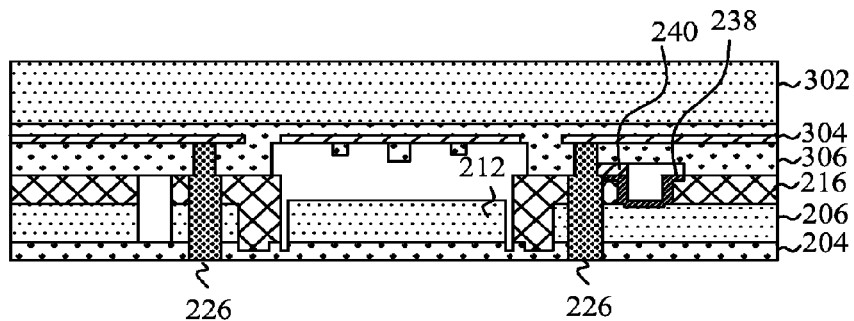

Similar to FIG. 2J above, FIG. 4J illustrates the formation of plugs 226 in openings 224 and 308 to provide an electrical connection between polysilicon electrode 220 and metal layer 304 of the semiconductor device 300. In one example, plugs 226 are comprised of tungsten and shaped to have a smaller diameter portion disposed within opening 308 and a wider diameter portion disposed within opening 224. Openings 218 provide for electrical isolation of plugs 226. A metal layer is deposited and then etched back to form plugs 226 within openings 224 and 308, and in one example, a tungsten layer is deposited by CVD at a process temperature less than about 500 degrees Celsius. Other deposition techniques are applicable and may be used.

Figure 4K:
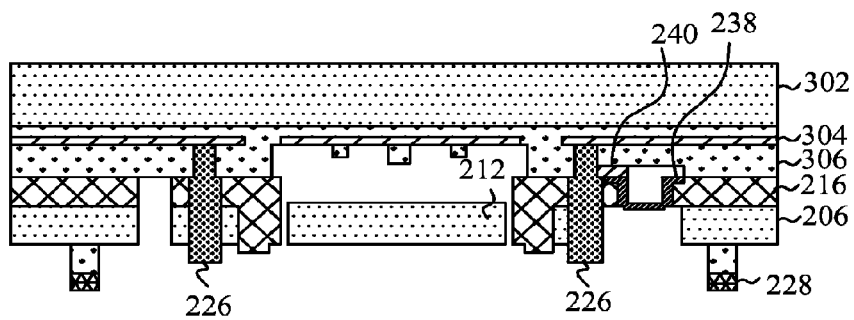

Similar to FIG. 2K above, FIG. 4K illustrates the formation of a bonding layer 228 on buried oxide layer 204, which is subsequently removed adjacent MEMS resonator element 212. The bonding layer 228 may be patterned by a wet etch process in one example. Alternatively, portions of the buried oxide layer 204 adjacent the MEMS resonator element 212 may be removed prior to formation of the bonding layer 228 on a remaining portion of buried oxide layer 228. The removal of buried oxide layer 204 releases MEMS resonator element 212. In one example, buried oxide layer 204 is removed by a vapor HF etch.

Figure 4L:
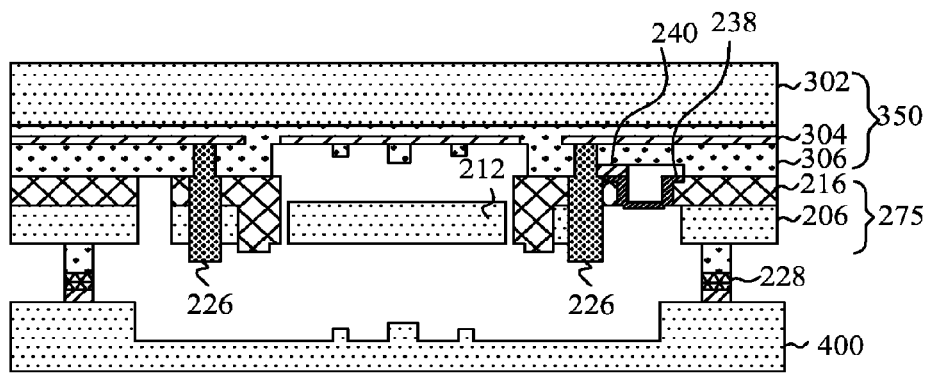

Finally, similar to FIG. 2L above, FIG. 4L illustrates substrate 206 bonded to a capping wafer 400 to seal the MEMS resonator element 212 between the capping wafer 400 and the semiconductor device 300. In other words, MEMS device 200 is sandwiched between capping wafer 400 and semiconductor device 300, which in one example is one of a CMOS wafer or a carrier wafer, and MEMS resonator element 212 is sealed within a cavity between semiconductor device 300 and capping wafer 400, both of which may include stand-off features for formation of the cavity for the MEMS resonator element 212.

The formation of the piezoelectric on silicon illustrated in FIGS. 3A-3F may be advantageously used in various devices such as resonators, actuators (e.g., switches), and energy harvesting devices. The formation of the suspended piezoelectric illustrated in FIGS. 4A-4L may be advantageously used in film acoustic wave devices.

One or more of the described embodiments may provide advantages over the prior art. The fusion bonding of a MEMS device to a semiconductor device allows for the creation of a robust electrical and mechanical interface between the two substrates. Further, the eutectic bonding of the MEMS device to a capping wafer allows for the creation of a hermetic seal without area loss and without the addition of any process layers to the semiconductor device, such as a CMOS substrate. The present disclosure further provides for a simple and flexible wafer packaging scheme for the fabrication of both a MEMS stand-alone device and a monolithic MEMS device-semiconductor device.

Although the embodiments illustrated herein may describe and/or illustrate a single bonding layer deposited on a substrate, this is not required and any plurality of layers may be patterned to form one or more bonding regions between substrates or devices.

Thus, the present disclosure provides a method for wafer level packaging to provide a stand-alone micro-electro-mechanical systems (MEMS) device or a monolithic semiconductor device-MEMS device. In one embodiment, a method includes providing a substrate including a buried oxide layer and a top oxide layer, and etching the substrate to form openings above the buried oxide layer and a micro-electro-mechanical systems (MEMS) resonator element between the openings, the MEMS resonator element enclosed within the buried oxide layer, the top oxide layer, and sidewall oxide layers. The method further includes filling the openings with polysilicon to form polysilicon electrodes adjacent the MEMS resonator element, removing the top oxide layer and the sidewall oxide layers adjacent the MEMS resonator element, bonding the polysilicon electrodes to one of a complementary metal-oxide semiconductor (CMOS) wafer or a carrier wafer, removing the buried oxide layer adjacent the MEMS resonator element, and bonding the substrate to a capping wafer to seal the MEMS resonator element between the capping wafer and one of the CMOS wafer or the carrier wafer.

The present disclosure also provides a semiconductor device. In one embodiment, the device includes a micro-electro-mechanical systems (MEMS) device including polysilicon electrodes adjacent a resonator element, one of a complementary metal-oxide semiconductor (CMOS) wafer or a carrier wafer fusion bonded to a first surface of the MEMS device, and a capping wafer eutectically bonded to a second surface of the MEMS device, the resonator element sealed between the capping wafer and one of the CMOS wafer or the carrier wafer.

Although embodiments of the present disclosure have been described in detail, those skilled in the art should understand that they may make various changes, substitutions and alterations herein without departing from the spirit and scope of the present disclosure. Accordingly, all such changes, substitutions and alterations are intended to be included within the scope of the present disclosure as defined in the following claims. In the claims, means-plus-function clauses are intended to cover the structures described herein as performing the recited function and not only structural equivalents, but also equivalent structures.

The invention claimed is:

1. A method, comprising:
providing a substrate including a top oxide layer and a buried oxide layer;
forming a micro-electro-mechanical systems (MEMS) resonator element that is enclosed within the substrate;
forming polysilicon electrodes adjacent to the MEMS resonator element;
exposing top and side surfaces of the MEMS resonator element;
bonding the polysilicon electrodes to a semiconductor device;
exposing a bottom surface of the MEMS resonator element; and
bonding the substrate to a capping wafer to seal the MEMS resonator element between the capping wafer and the semiconductor device.

2. The method of claim 1, wherein exposing the top and side surfaces of the MEMS resonator element comprises etching openings lateral to and above the MEMS resonator element.

3. The method of claim 1, further comprising forming a bonding layer on the substrate.

4. The method of claim 3, further comprising bonding the bonding layer to the capping wafer.

5. The method of claim 1, further comprising forming metal plugs to provide an electrical connection between a polysilicon electrode and a metal layer of the semiconductor device.

6. The method of claim 1, further comprising etching a polysilicon electrode and the substrate to form an opening.

7. The method of claim 6, further comprising depositing and patterning an aluminum nitride (AlN) film over the opening.

8. The method of claim 7, wherein the AlN film is deposited at a temperature below about 550° C. and is patterned by wet etching.

9. The method of claim 1, further comprising etching a polysilicon electrode to form an opening.

10. The method of claim 9, further comprising depositing and patterning an aluminum nitride (AlN) film over the opening, and depositing and patterning an aluminum film above the AlN film.

11. The method of claim 10, wherein the aluminum film is deposited at a temperature of about 250° C. and is patterned by wet etching.

12. A method, comprising:
providing a substrate including a top oxide layer and a buried oxide layer;
forming a micro-electro-mechanical systems (MEMS) resonator element that is enclosed within the substrate;
forming polysilicon electrodes adjacent to the MEMS resonator element;
etching openings lateral to and above the MEMS resonator element;
etching at least one of the polysilicon electrodes and the substrate to form an opening;
bonding the polysilicon electrodes to a semiconductor device;
releasing the MEMS resonator element; and
bonding the substrate to a capping wafer to seal the MEMS resonator element between the capping wafer and the semiconductor device.

13. The method of claim 12, further comprising depositing and patterning an aluminum nitride (AlN) film over the opening.

14. The method of claim 13, wherein the AlN film is deposited at a temperature below about 550° C. and is patterned by wet etching.

15. The method of claim 1, further comprising forming a bonding layer on the substrate and bonding the bonding layer to the capping wafer.

16. The method of claim 12, further comprising forming metal plugs to provide an electrical connection between a polysilicon electrode and a metal layer of the semiconductor device.

17. A method, comprising:
providing a substrate including a top oxide layer and a buried oxide layer;
forming a micro-electro-mechanical systems (MEMS) resonator element that is enclosed within the substrate;
forming polysilicon electrodes adjacent to the MEMS resonator element;
exposing top, bottom, and side surfaces of the MEMS resonator element;
etching a polysilicon electrode to form an opening;

bonding the polysilicon electrodes to a complementary metal-oxide semiconductor (CMOS) wafer or a carrier wafer; and bonding the substrate to a capping wafer to seal the MEMS resonator element between the capping wafer and the CMOS wafer or carrier wafer.

18. The method of claim 17, further comprising depositing and patterning an aluminum nitride (AlN) film over the opening, and depositing and patterning an aluminum film above the AlN film.

19. The method of claim 18, wherein the aluminum film is deposited at a temperature of about 250° C. and is patterned by wet etching.

20. The method of claim 17, further comprising forming metal plugs to provide an electrical connection between a polysilicon electrode and a metal layer of the CMOS wafer or carrier wafer.

* * * * *